United States Patent
Liang et al.

(10) Patent No.: US 8,742,751 B2
(45) Date of Patent: Jun. 3, 2014

(54) MAGNETIC FIELD MEASURING DEVICE

(75) Inventors: Yan Liang, Shenzhen (CN); Qian-Long Liao, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 394 days.

(21) Appl. No.: 13/108,096

(22) Filed: May 16, 2011

(65) Prior Publication Data

US 2012/0153939 A1   Jun. 21, 2012

(30) Foreign Application Priority Data

Dec. 21, 2010   (CN) .......................... 2010 1 0598604

(51) Int. Cl.
*G01B 7/30* (2006.01)
*G01D 5/14* (2006.01)
*G01B 3/00* (2006.01)

(52) U.S. Cl.
CPC *G01B 7/30* (2013.01); *G01D 5/145* (2013.01); *G01B 3/00* (2013.01)
USPC .................. 324/207.25; 324/207.11; 324/205; 324/207.24; 324/260; 324/261

(58) Field of Classification Search
CPC ............. G01B 7/30; G01B 3/00; G01D 5/145
USPC .......... 324/207.25, 207.11, 205, 207.24, 260, 324/261
See application file for complete search history.

(56) References Cited

U.S. PATENT DOCUMENTS

| | | | | |
|---|---|---|---|---|
| 2,076,100 | A * | 4/1937 | Spitzglass | 324/113 |
| 3,442,018 | A * | 5/1969 | Viollet | 33/832 |
| 3,891,040 | A * | 6/1975 | Schmitter | 177/230 |
| 4,186,340 | A * | 1/1980 | daCosta et al. | 324/205 |
| 4,931,732 | A | 6/1990 | Moon | |
| 5,559,432 | A * | 9/1996 | Logue | 324/207.17 |
| 5,889,400 | A * | 3/1999 | Nakazawa | 324/207.2 |
| 7,078,893 | B2 * | 7/2006 | Nakano et al. | 324/207.25 |
| 2005/0127903 | A1 * | 6/2005 | Sogge | 324/207.2 |
| 2006/0119353 | A1 * | 6/2006 | Nakano et al. | 324/207.25 |
| 2007/0029007 | A1 * | 2/2007 | Hutchinson | 141/330 |
| 2008/0290574 | A1 * | 11/2008 | Lv | 269/8 |
| 2012/0297892 | A1 * | 11/2012 | Neuburger et al. | 73/861.12 |

OTHER PUBLICATIONS

"Navy Electricity and Electronics Training Series: Introduction to Test Equipment", Naval Education and Training Program Development Center, NAVEDTRA 172-16-00-84, 1984, pp. 1-30.*

* cited by examiner

*Primary Examiner* — Patrick Assouad
*Assistant Examiner* — Lamarr Brown
(74) *Attorney, Agent, or Firm* — Novak Druce Connolly Bove + Quigg LLP

(57) ABSTRACT

A magnetic field measuring device includes a support base, a measuring mechanism, and a displacement sensor. The measuring mechanism is positioned on the support base, and includes a mounting plate, a swing arm, a connecting member, an elastic member, and a measuring magnet. The mounting plate is connected to the support base. The swing arm is rotatably positioned on the mounting plate. The elastic member is positioned between the connecting member and the swing arm. The measuring magnet is connected to the swing arm, opposite to the support base. The displacement sensor is positioned on the support base, opposite to the swing arm.

9 Claims, 4 Drawing Sheets

MAGNETIC FIELD MEASURING DEVICE

BACKGROUND

1. Technical Field

The present disclosure relates to measuring devices and, more particularly, to a magnetic field measuring device for simultaneously measuring polarity and intensity of a magnetic field.

2. Description of Related Art

Magnets are widely used in electronic devices, such as speakers and so on. When the magnets are assembled into the electronic devices, orientation of the magnets is important, so that the magnets can provide sufficient magnetic field strength to make electronic devices work properly.

Gauss meters are often used to measure the magnetic field intensity. Gauss meters include a main body with a display and a measuring tip connected to the main body. When the measuring tip touches electronic devices, the display will indicate measured values.

However, current Gauss meters cannot distinguish the south pole and the north pole of a magnet, therefore, during the assembly process of the magnet, the magnet can be installed in the wrong orientation. In addition, when using a Gauss meter, the measuring tip needs to touch many portions of the electronic devices, to determine the magnetic field intensity around the electronic devices. Thus, the measuring operation is complicated.

Therefore, there is room for improvement within the art.

BRIEF DESCRIPTION OF THE DRAWINGS

The components in the drawings are not necessarily drawn to scale, the emphasis instead placed upon clearly illustrating the principles of the present disclosure. Moreover, in the drawings, like reference numerals designate corresponding parts throughout the several views.

DETAILED DESCRIPTION

Figure 1:
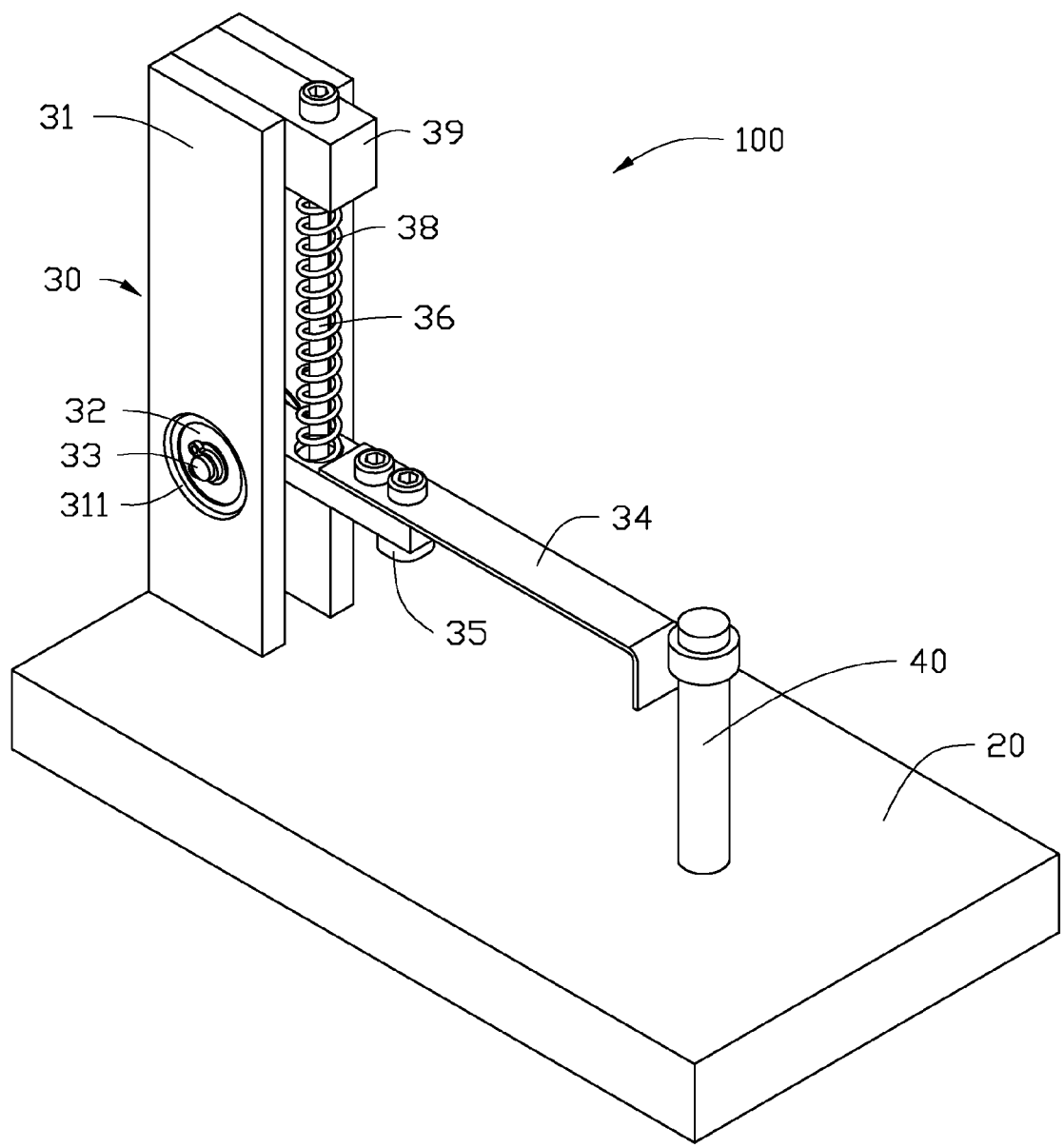
FIG. 1 is an isometric view of an embodiment of a magnetic field measuring device, the magnetic field measuring device including a support base, a measuring mechanism, and a displacement sensor.
Figure 2:
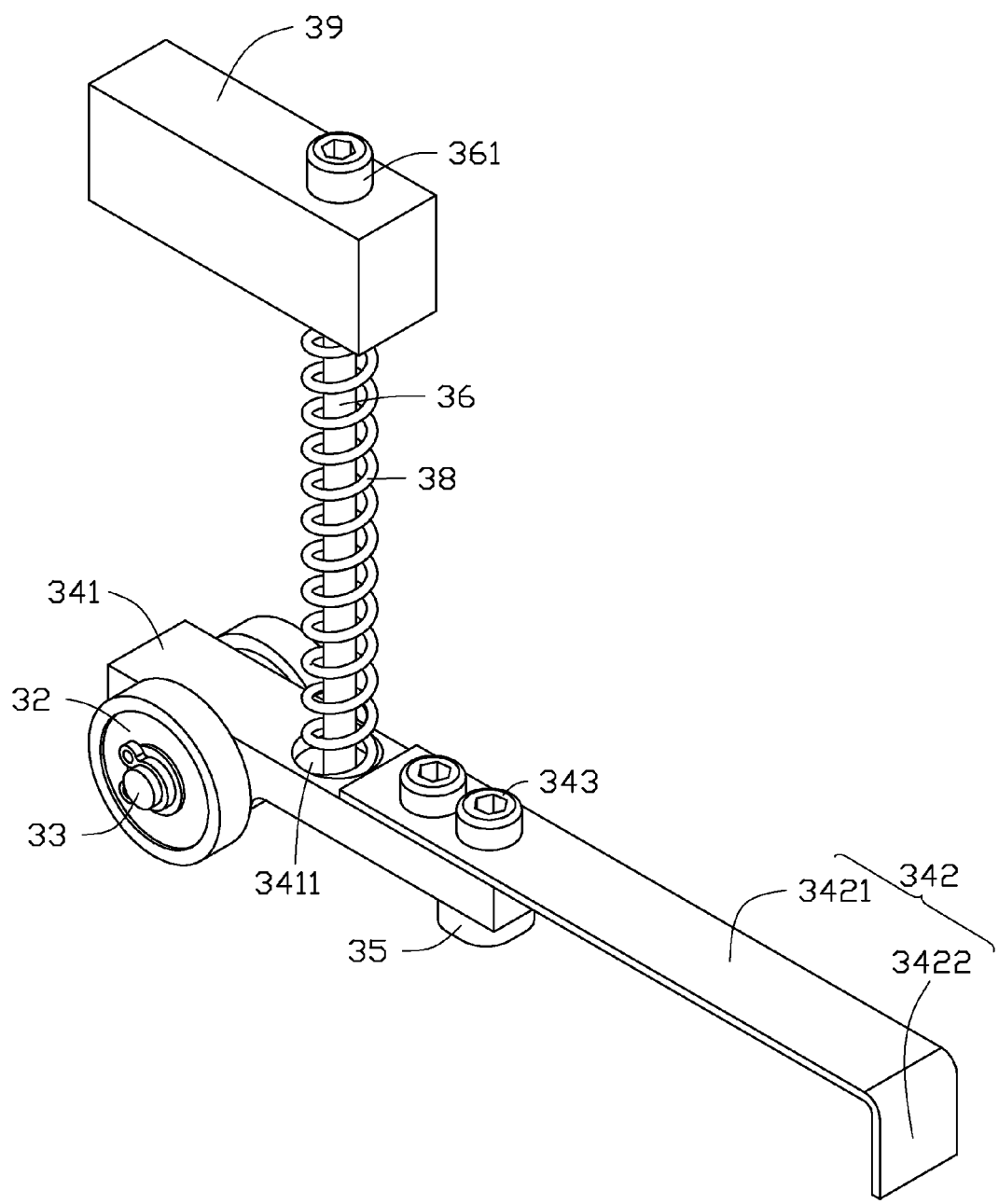
FIG. 2 is an isometric view of the measuring mechanism of FIG. 1, without a pair of mounting plates.
Figure 3:
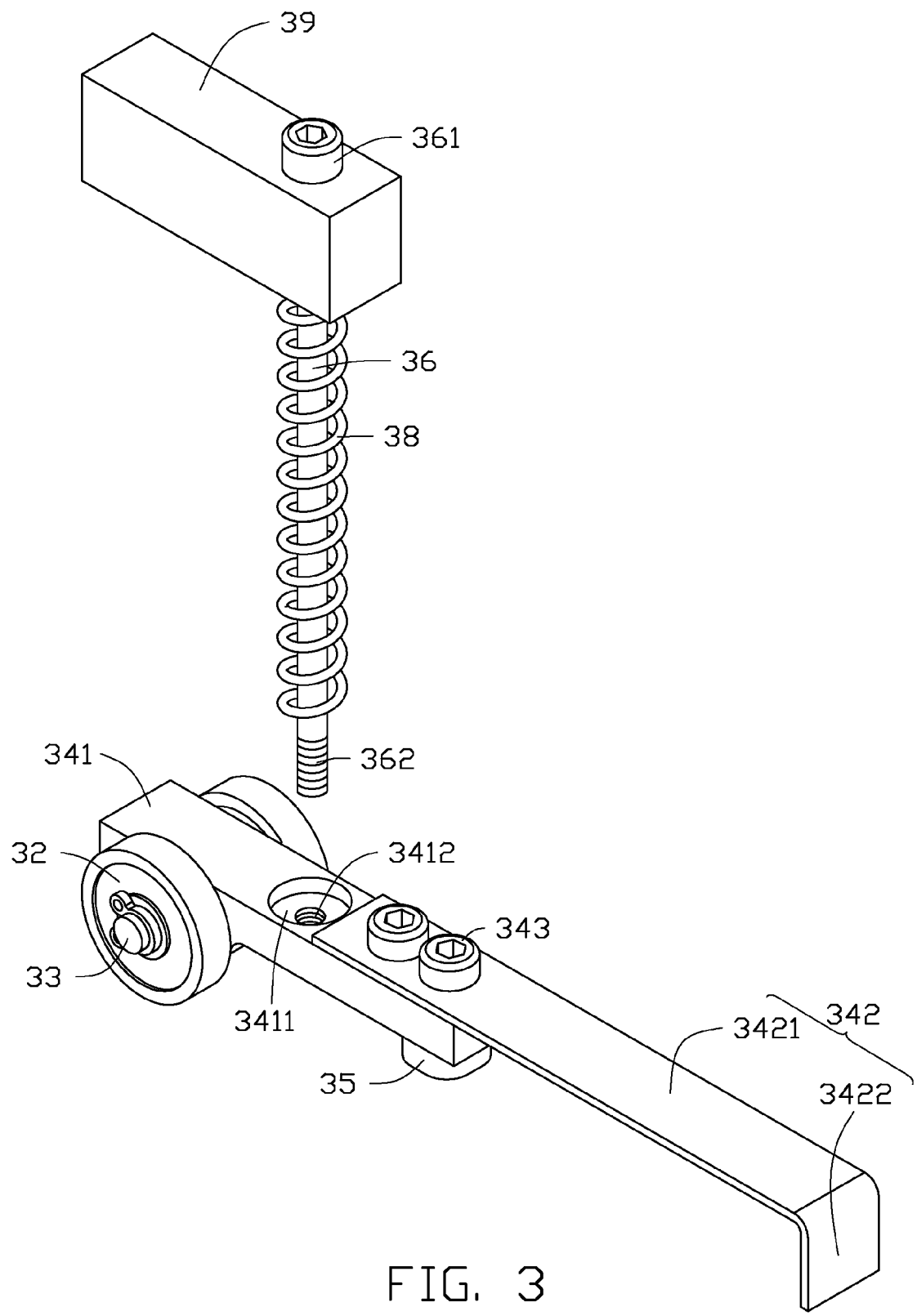
FIG. 3 is an exploded, isometric view of the measuring mechanism of FIG. 2.

Referring to FIGS. 1 through 3, a magnetic field measuring device 100 includes a support base 20, a measuring mechanism 30, and a displacement sensor 40. The measuring mechanism 30 and the displacement sensor 40 are fixed on the support base 20, and opposite to each other. In the illustrated embodiment, the support base 20 is substantially rectangular.

The measuring mechanism 30 includes two mounting plates 31, two bearings 32, a rotatable shaft 33, a swing arm 34, a measuring magnet 35, a connecting shaft 36, an elastic member 38, and a connecting member 39. In the illustrated embodiment, the mounting plates 31 are substantially rectangular, and each defines an assembly hole 311 for receiving one bearing 32.

The two bearings 32 are mounted at opposite ends of the rotatable shaft 33, and positioned in the assembly holes 311 of the mounting plates 31, respectively.

The swing arm 34 includes a main portion 341, a measuring portion 342, and two fixing members 343 for fixing the measuring portion 342 to the main portion 341. One end of the main portion 341 is connected to the rotatable shaft 33 between the two bearings 32, and the other end of the main portion 341 is connected to the measuring portion 342. The main portion 341 defines a receiving groove 3411 in a middle portion. A bottom wall defining the receiving groove 3411 defines a threaded hole 3412 throughout the main portion 341. The measuring portion 342 includes a support piece 3421 and a measuring tip 3422 extending substantially perpendicularly from the support piece 3421. The measuring magnet 35 is positioned on an end of the main portion 341 adjacent to the measuring portion 342.

The connecting member 39 connects the mounting plates 31 together at a top end. The connecting shaft 36 forms a head portion 361 and a threaded portion 362 on opposite ends. The threaded portion 362 extends through the connecting member 39, and engages in the threaded hole 3412 of the swing arm 34, with the head portion 361 contacting the connecting member 39.

The elastic member 38 is sleeved on the connecting shaft 36 between the connecting member 39 and the swing arm 34. In the illustrated embodiment, the elastic member 38 is a compression spring.

Figure 4:
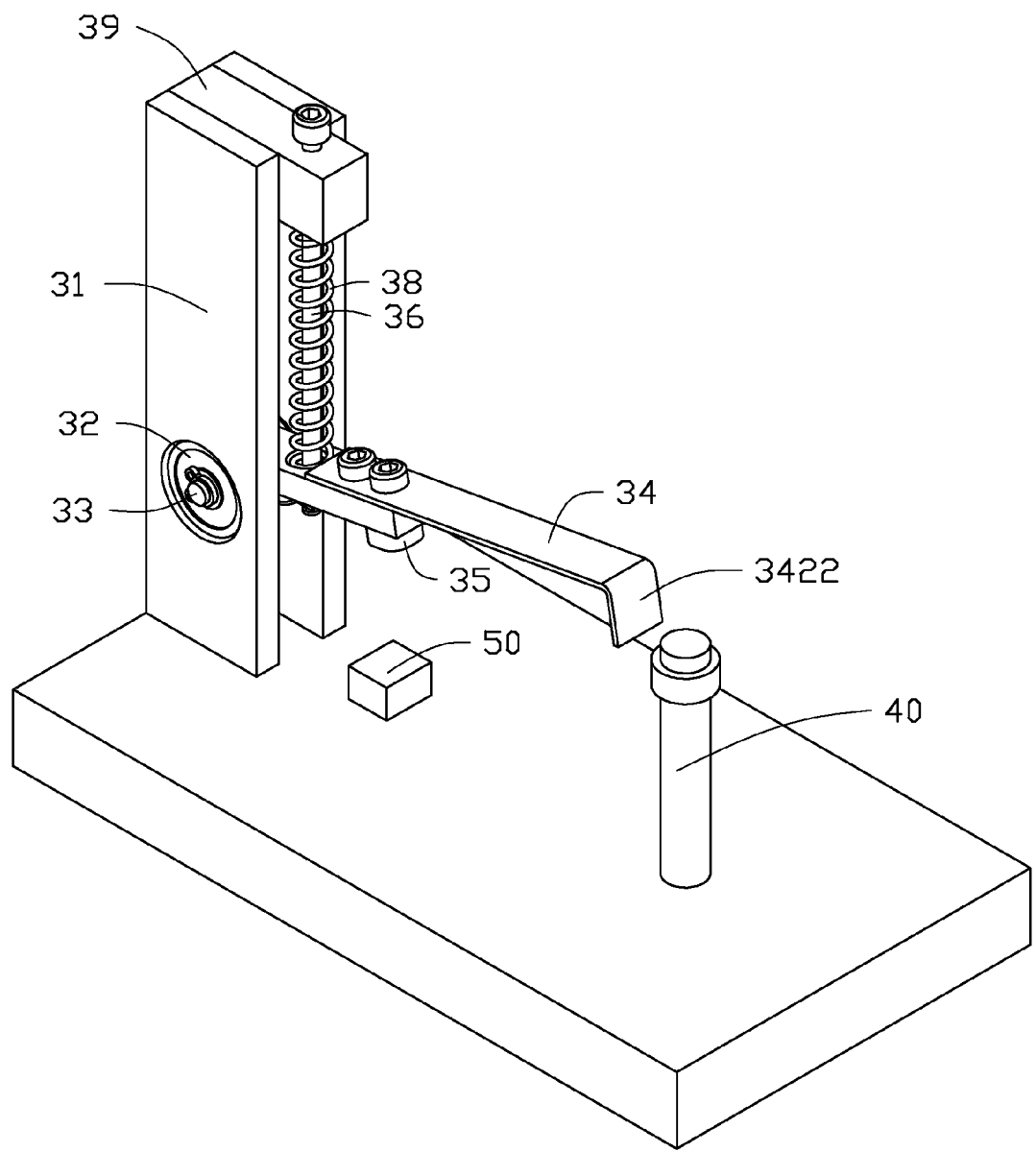
FIG. 4 is an isometric view of the magnetic field measuring device of FIG. 1 measuring a tested magnet.

Referring to FIG. 4, in use, a tested magnet 50 to be measured is positioned on the support base 20, opposite to the measuring magnet 35. When the tested magnet 50 has a same polarity as the measuring magnet 35, a magnetic repelling force is generated therebetween, and the swing arm 34 is driven to rotate around the rotatable shaft 33 by the repelling force. As a result, the connecting shaft 36 moves upwards, and compresses the elastic member 38 to generate an elastic force. When the elastic force is equal to the repelling force, the swing arm 34 stops rotating. The displacement sensor 40 measures the displacement of the measuring tip 3422. When the displacement of the measuring tip 3422 is greater than a predetermined value, a signal such as a light source (not shown) electrically connected to the displacement sensor 40 can emit light. That is, the magnetic field intensity of the tested magnet 50 has met the requirements.

When the polarity of the tested magnet 50 is different from that of the measuring magnet 35, a magnetic attraction force is generated therebetween, the swing arm 34 is not driven to rotate around the rotatable shaft 33, because the connecting shaft 36 connecting the swing arm 34 to the connecting member 39 prevents the swing arm 34 from rotating. That is, the polarity of the tested magnet 50 does not meet the requirements and the light source of the sensor 40 will not light up.

The magnetic field measuring device 100 can distinguish the polarity of the tested magnet 50 and determine if the magnetic field intensity of the tested magnet 50 meets the requirements, by the mere positioning of the tested magnet 50 on the support base 20. Therefore, the measuring efficiency of the magnetic field measuring device 100 is high. In addition, a threaded depth of the threaded portion 362 in the swing arm 34 can be changed by rotating the connecting shaft 36, thereby adjusting the initial elastic force of the elastic member 38 to measure another tested magnet with a higher magnetic field intensity than the tested magnet 50. Alternatively, the elastic member 38 can be replaced by other elastic members to achieve different starting pressures.

It should be appreciated that the connecting shaft 36 can be omitted in the magnetic field measuring device 100. In this case, the elastic member 38 directly connects the swing arm 34 to the connecting member 39. The magnetic field measuring device 100 may include only one mounting plate 31 and only one bearing 32 positioned on the mounting plate 31, and the swing arm 34 is rotatably connected to the bearing 32 via the rotatable shaft 33.

It is believed that the present embodiments and their advantages will be understood from the foregoing description, and it will be apparent that various changes may be made thereto without departing from the spirit and scope of the disclosure or sacrificing all of its material advantages.

What is claimed is:

1. A magnetic field measuring device, comprising:
a support base for supporting a magnet to be tested;
a measuring mechanism positioned on the support base, the measuring mechanism comprising:
a mounting plate substantially perpendicularly connected to the support base;
a swing arm rotatably positioned on the mounting plate;
a connecting member securely connected to a top end of the mounting plate;
a connecting shaft, one end of the connecting shaft slidably connected to the connecting member, the other end of the connecting shaft screwed with the swing arm;
an elastic member sleeved on the connecting shaft, opposite ends of the elastic member resisting the connecting member and the swing arm, respectively;
a measuring magnet connected to the swing arm, facing the support base; and
a displacement sensor positioned on the support base, opposite to the swing arm, wherein the magnet to be tested is positioned on the support base opposite to the measuring magnet, when the swing arm rotates by a magnetic repelling force generated between the magnet to be tested and the measuring magnet, the connecting shaft slides relative to the connecting member, the swing arm and the connecting shaft cooperatively form an acute angle, and the elastic member is in a compressed state.

2. The magnetic field measuring device of claim 1, wherein the measuring mechanism further comprises a rotatable shaft, and the swing arm is rotatably positioned on the mounting plate via the rotatable shaft.

3. The magnetic field measuring device of claim 2, wherein the measuring mechanism further comprises a bearing positioned on the mounting plate, and the rotatable shaft is positioned on the bearing.

4. The magnetic field measuring device of claim 1, wherein a threaded portion is formed on an end of the connecting shaft, the swing arm defines a threaded hole, and the connecting shaft engages in the threaded hole of the swing arm.

5. The magnetic field measuring device of claim 4, wherein the swing arm defines a receiving groove communicating with the threaded hole, and an end of the elastic member is received in the receiving groove.

6. The magnetic field measuring device of claim 1, wherein the swing arm comprises a main portion, a measuring portion, and at least one fixing members for fixing the measuring portion to the main portion, the main portion is rotatably connected to the mounting plate.

7. The magnetic field measuring device of claim 6, wherein the measuring magnet is fixed to an end of the main portion adjacent to the measuring portion.

8. The magnetic field measuring device of claim 6, wherein the measuring portion comprises a support piece and a measuring tip extending substantially perpendicularly from the support piece, and the measuring tip is opposite to the displacement sensor.

9. The magnetic field measuring device of claim 1, wherein the elastic member is a compression spring.

* * * * *